United States Patent
Zamir et al.

(10) Patent No.: US 11,456,758 B1
(45) Date of Patent: Sep. 27, 2022

(54) ADAPTIVE SOFT-BIT COMPRESSION IN FLASH MEMORY

(71) Applicant: Western Digital Technologies, Inc., San Jose, CA (US)

(72) Inventors: Ran Zamir, Ramat Gan (IL); Eran Sharon, Rishon Lezion (IL); Alexander Bazarsky, Holon (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/239,057

(22) Filed: Apr. 23, 2021

(51) Int. Cl.
| | |
|---|---|
| H03M 13/35 | (2006.01) |
| G06F 11/10 | (2006.01) |
| G11C 16/26 | (2006.01) |
| H03M 7/30 | (2006.01) |
| G11C 16/04 | (2006.01) |

(52) U.S. Cl.
CPC ....... H03M 13/353 (2013.01); G06F 11/1076 (2013.01); G11C 16/26 (2013.01); H03M 7/3059 (2013.01); G11C 16/0483 (2013.01)

(58) Field of Classification Search
CPC .............. H03M 13/353; H03M 7/3059; G06F 11/1076; G11C 16/26; G11C 16/0483
See application file for complete search history.

(56) References Cited

U.S. PATENT DOCUMENTS

| | | | |
|---|---|---|---|
| 8,099,652 B1 | 1/2012 | Alrod et al. | |
| 8,464,131 B2 | 6/2013 | Sharon et al. | |
| 8,509,000 B2 | 8/2013 | Sharon et al. | |
| 8,873,285 B2 | 10/2014 | Sharon et al. | |
| 9,032,269 B2 | 5/2015 | Sharon et al. | |
| 9,329,928 B2 | 5/2016 | Fitzpatrick et al. | |
| 9,406,377 B2 | 8/2016 | Conley et al. | |
| 9,491,023 B2 | 11/2016 | Butussi et al. | |
| 9,641,378 B1 | 5/2017 | Steffen | |
| 9,882,678 B2 | 1/2018 | Nekuii | |
| 9,946,468 B2 | 4/2018 | Conley et al. | |
| 10,275,186 B2 | 4/2019 | Sharon et al. | |
| 10,474,525 B2 | 11/2019 | Sharon et al. | |
| 10,715,177 B2 | 7/2020 | Ki et al. | |
| 2006/0193470 A1 | 8/2006 | Williams | |
| 2014/0237315 A1 | 8/2014 | Fitzpatrick et al. | |
| 2017/0046220 A1* | 2/2017 | Sharon | G06F 3/064 |
| 2017/0153844 A1* | 6/2017 | Kwon | G06F 3/0685 |
| 2018/0159559 A1* | 6/2018 | Bazarsky | H03M 13/3715 |

(Continued)

Primary Examiner — Kyle Vallecillo
(74) Attorney, Agent, or Firm — Michael Best & Friedrich LLP

(57) ABSTRACT

A memory includes, in one embodiment, NAND elements; read/write circuitry; and compressed soft-bit circuitry. The compressed soft-bit circuitry is configured to determine or receive one or more NAND conditions and then determine a soft-bit delta and select a compression scheme based on the NAND conditions. The read/write circuitry is configured to read a set of hard bits from the NAND elements and sense a first set of soft-bits using the determined soft-bit delta while reading the set of hard bits from the NAND elements. The first set of soft-bits has a first fixed size, and each soft-bit of the first set of soft-bits indicates a reliability of a corresponding hard bit of the set of hard bits. The compressed soft-bit circuitry is also configured to generate a second set of soft-bits based on the selected compression scheme and output the second set of soft-bits to a controller.

20 Claims, 5 Drawing Sheets

(56) References Cited

U.S. PATENT DOCUMENTS

2018/0159560 A1* 6/2018 Sharon .................... G06F 3/067
2018/0175889 A1* 6/2018 Bazarsky .......... H03M 13/6325
2020/0042378 A1* 2/2020 Pele ...................... G06F 11/10
2022/0116053 A1   4/2022 Zamir et al.

* cited by examiner

ADAPTIVE SOFT-BIT COMPRESSION IN FLASH MEMORY

BACKGROUND

This application relates generally to memory devices and, more particularly, to adaptive soft-bit compression in memory devices.

Non-volatile storage devices include flash memory devices and other storage devices. In a flash memory device, a storage element may be programmed to store a particular threshold voltage that indicates one or more bit values. For example, a particular range of threshold voltages may correspond to a logic "1" bit value, and another range of threshold voltages may correspond to a logic "0" bit value.

Non-volatile storage devices may use error correction techniques to improve reliability of data storage and retrieval. For example, data may be encoded prior to being stored, and the data may be decoded after being read from the storage device to correct one or more errors in the data (up to an error correction capability, such as a probabilistic error correction capability).

Certain error correction techniques use soft-bits to improve the error correction capability. These soft-bits may be generated by reading higher/lower than the transition and marking the bits near the transition threshold. A soft-bit may indicate a reliability of a hard bit read from a storage element. As an example, a hard bit may indicate a logic "0" bit value, and a soft-bit corresponding to the hard bit may indicate that the logic "0" bit value is relatively reliable (e.g., if a read voltage that reflects a state of a storage element is relatively far from the read threshold) or that the logic "0" bit value is relatively unreliable (e.g., if the read voltage indicating the state of the storage element is adjacent to a boundary of the target range of threshold voltages). Soft-bits may improve a decoding process by indicating which data bits are likely to be "incorrect" (e.g., due to being near a boundary of a threshold voltage range). Generating and using soft-bits consumes resources at a storage device. For example, additional sensing operations may be performed to generate soft-bits (as compared to generating only hard bits during a read process). As another example, transferring soft-bits from a memory to a controller may use system bandwidth and may reduce resources available for other operations, which may slow performance of the memory in some cases.

SUMMARY

As non-volatile memory cell size shrinks, and cell density increases, the reliability requirements for non-volatile memory storage devices become more challenging. The increased reliability requirements may be met by providing soft-bits that increase the storage device error correction capability at the expense of performance, processing time, power consumption, and complexity.

Previous implementations of soft-bit compression include fixed (non-adaptive) compression schemes. Furthermore, soft-bit delta is also not adaptively adjusted. By not adapting these the compression ratio and the soft-bit (SB) delta (especially to the NAND bit-error-rate (BER)), the soft-bit is either not informative enough resulting in decoding failures, or the soft-bit is excessively informative and may be further compressed to reduce the soft-bit page, thereby reducing the traffic between the NAND and the controller.

The present disclosure includes devices, methods, and apparatuses that have adaptive soft-bit compression. By adaptively compressing the soft-bit page, the size of the soft-bit page may be significantly reduced, saving both the latency and power associated with its transfer from the memory array to the controller. In normal operating conditions, only a small proportion of the bits are marked as 'unreliable' by the soft-bit page, allowing for very efficient compression of the soft-bit data by factors of two to eight.

The disclosure provides a memory including, in one embodiment, one or more storage elements, compressed soft-bit circuitry, and read/write circuitry. The compressed soft-bit circuitry is configured to determine a soft-bit delta and a compression scheme based on one or more conditions of the one or more storage elements. The read/write circuitry configured to read a set of hard bits from the one or more storage elements, and sense a first set of soft-bits using the determined soft-bit delta while reading the set of hard bits from the one or more storage elements, the first set of soft-bits having a first fixed size, and each soft-bit of the first set of soft-bits indicating a reliability of a corresponding hard bit of the set of hard bits. The compressed soft-bit circuitry is further configured to receive the first set of soft-bits, generate a second set of soft-bits from the first set of soft-bits based on the determined compression scheme, and output the second set of soft-bits.

The disclosure also provides a method. In one embodiment, the method includes determining, with compressed soft-bit circuitry, a soft-bit delta and a compression scheme based on one or more conditions of one or more storage elements. The method includes reading, with read/write circuitry, a set of hard bits from the one or more storage elements. The method includes sensing, with the compressed soft-bit circuitry, a first set of soft-bits using the determined soft-bit delta while reading the set of hard bits from the one or more storage elements, the first set of soft-bits having a first fixed size, and each soft-bit of the first set of soft-bits indicating a reliability of a corresponding hard bit of the set of hard bits. The method includes receiving, with the compressed soft-bit circuitry, the first set of soft-bits. The method includes generating, with the compressed soft-bit circuitry, a second set of soft-bits based on the determined compression scheme. The method also includes outputting the second set of soft-bits.

The disclosure also provides an apparatus including, in one embodiment, means for determining a soft-bit delta and a compression scheme based on one or more conditions of one or more storage elements, means for reading a set of hard bits from the one or more storage elements, means for sensing a first set of soft-bits using the determined soft-bit delta while reading the set of hard bits from the one or more storage elements, the first set of soft-bits having a first fixed size, and each soft-bit of the first set of soft-bits indicating a reliability of a corresponding hard bit of the set of hard bits, means for receiving the first set of soft-bits, means for generating a second set of soft-bits based on the determined compression scheme, and means for outputting the second set of soft-bits.

In this manner, various aspects of the disclosure provide for improvements in at least the technical fields of memory devices and their design and architecture. The disclosure can be embodied in various forms, including hardware or circuits controlled by firmware (i.e., code executing on a processor), computer systems and networks, user interfaces, and application programming interfaces; as well as hardware-implemented methods, signal processing circuits, memory arrays, application specific integrated circuits, field programmable gate arrays, and the like. The foregoing

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the memory device may be performed by hardware (e.g., analog or digital circuits), a combination of hardware and software (e.g., program code or firmware, stored in a non-transitory computer-readable medium, that is executed by processing or control circuitry), or any other suitable means. The following description is intended solely to give a general idea of various aspects of the disclosure, and does not limit the scope of the disclosure in any way.

Figure 1:
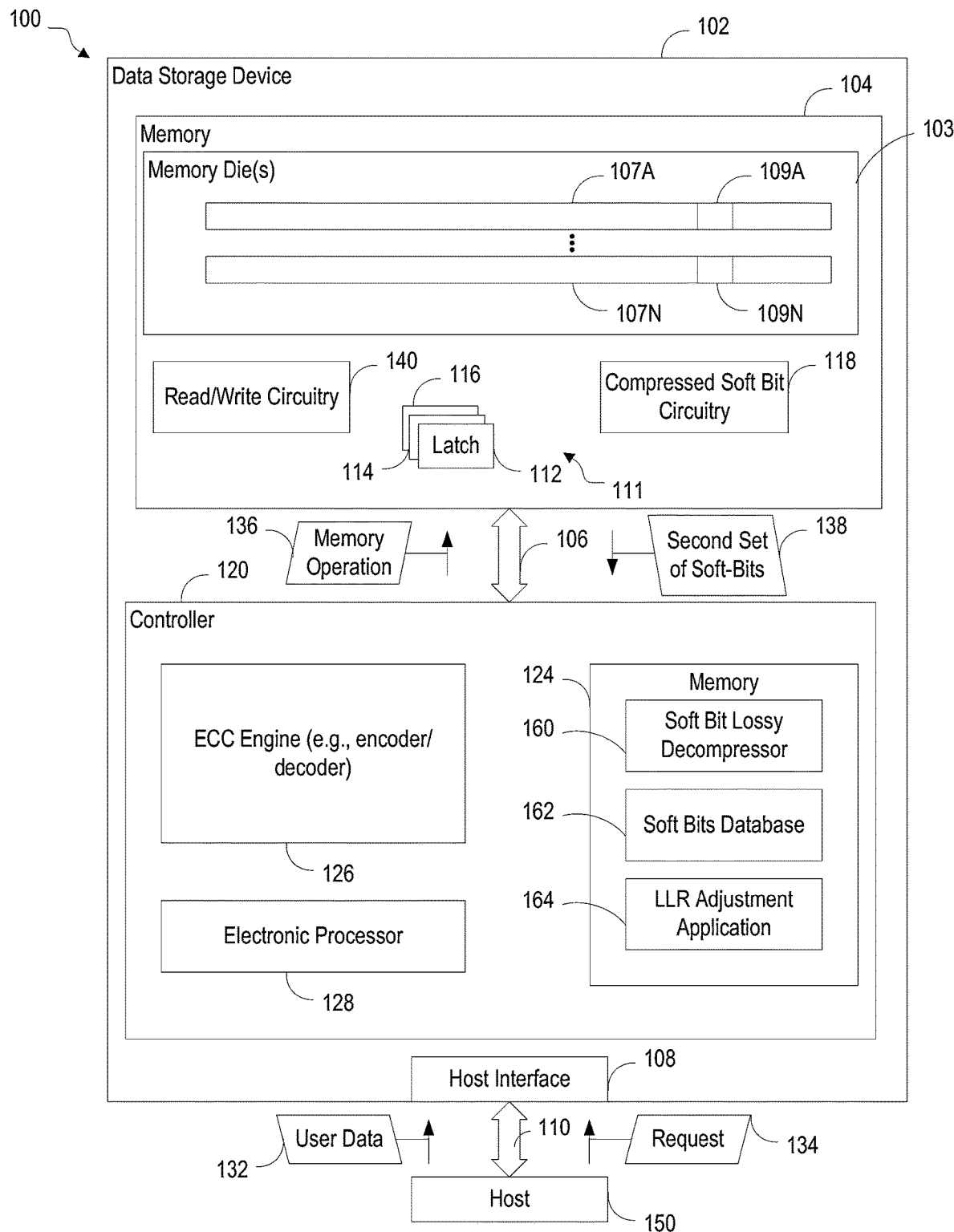
FIG. 1 is block diagram of a system including a data storage device that has fixed size soft-bit lossy compression, in accordance with some embodiments of the disclosure.

FIG. 1 is block diagram of a system including a data storage device that has fixed size soft-bit lossy compression, in accordance with some embodiments of the disclosure. In the example of FIG. 1, the system 100 includes a data storage device 102 and a host device 150. The data storage device 102 includes a controller 120 and a memory 104 (e.g., non-volatile memory) that is coupled to the controller 120.

One example of the structural and functional features provided by the controller 120 are illustrated in FIG. 1. However, the controller 120 is not limited to the structural and functional features provided by the controller 120 in FIG. 1. The controller 120 may include fewer or additional structural and functional features that are not illustrated in FIG. 1.

The data storage device 102 and the host device 150 may be operationally coupled via a connection (e.g., a communication path 110), such as a bus or a wireless connection. In some examples, the data storage device 102 may be embedded within the host device 150. Alternatively, in other examples, the data storage device 102 may be removable from the host device 150 (i.e., "removably" coupled to the host device 150). As an example, the data storage device 102 may be removably coupled to the host device 150 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 150 via the communication path 110, such as a wired communication path and/or a wireless communication path. For example, the data storage device 102 may include an interface 108 (e.g., a host interface) that enables communication via the communication path 110 between the data storage device 102 and the host device 150, such as when the interface 108 is communicatively coupled to the host device 150.

The host device 150 may include an electronic processor and a memory. The memory may be configured to store data and/or instructions that may be executable by the electronic processor. The memory may be a single memory or may include one or more memories, such as one or more non-volatile memories, one or more volatile memories, or a combination thereof. The host device 150 may issue one or more commands to the data storage device 102, such as one or more requests to erase data at, read data from, or write data to the memory 104 of the data storage device 102. For example, the host device 150 may be configured to provide data, such as user data 132, to be stored at the memory 104 or to request data to be read from the memory 104. The host device 150 may include a mobile smartphone, a music player, a video player, a gaming console, an electronic book reader, a personal digital assistant (PDA), a computer, such as a laptop computer or notebook computer, any combination thereof, or other suitable electronic device.

The host device 150 communicates via a memory interface that enables reading from the memory 104 and writing to the memory 104. In some examples, the host device 150 may operate in compliance with an industry specification, such as a Universal Flash Storage (UFS) Host Controller Interface specification. In other examples, the host device 150 may operate in compliance with one or more other specifications, such as a Secure Digital (SD) Host Controller specification or other suitable industry specification. The host device 150 may also communicate with the memory 104 in accordance with any other suitable communication protocol.

The memory 104 of the data storage device 102 may include a non-volatile memory (e.g., NAND, BiCS family of memories, or other suitable memory). In some examples, the memory 104 may be any type of flash memory. For example, the memory 104 may be two-dimensional (2D) memory or three-dimensional (3D) flash memory. The memory 104 may include one or more memory dies 103. Each of the one or more memory dies 103 may include one or more blocks (e.g., one or more erase blocks). Each block may include one or more groups of storage elements, such as a representative group of storage elements 107A-107N. The group of storage elements 107A-107N may be configured as a word line. The group of storage elements 107 may include multiple storage elements (e.g., memory cells that are referred to herein as a "string"), such as a representative storage elements 109A and 109N, respectively.

The memory 104 may include support circuitry, such as read/write circuitry 140, to support operation of the one or more memory dies 103. Although depicted as a single component, the read/write circuitry 140 may be divided into separate components of the memory 104, such as read circuitry and write circuitry. The read/write circuitry 140 may be external to the one or more memory dies 103 of the memory 104. Alternatively, one or more individual memory dies may include corresponding read/write circuitry that is operable to read from and/or write to storage elements within the individual memory die independent of any other read and/or write operations at any of the other memory dies.

The memory 104 may further include one or more latches (e.g., a set of latches 111 including latches 112, 114, and 116) and compressed soft-bit (CSB) circuitry 118. In some examples, one or more CSB operations may be performed using the read/write circuitry 140. The memory array 104, the read/write circuitry 140, the CSB circuitry 118 may be integrated within a memory die of the memory 104. In one example, the CSB circuitry 118 is replicated and a part of each memory die either by integrating the CSB circuitry 118 with the memory die or by bonding dies including the CSB circuitry to respective memory dies. The CSB circuitry 118 may be coupled to one or more of the memory array 104, the read/write circuitry 140, one or more of the latches 112, 114, and 116, or a connection between the memory 104 and the controller 120, such as a memory-to-controller bus 106.

The CSB circuitry 118 may include one or more logic gates, such as one or more AND logic gates. Alternatively or additionally, the CSB circuitry 118 may include one or more other logic gates, for example, one or more OR logic gates, one or more exclusive-OR (XOR) logic gates, one or more inverter (NOT) logic gates, one or more NOT-AND (NAND) logic gates, one or more NOT-OR (NOR) logic gates, one or more exclusive-NOR (XNOR) gates, one or more other logic gates, or a combination thereof. In other examples, the CSB circuitry 118 may be omitted from the memory 104, and operations described with reference to the CSB circuitry 118 may be performed at the latches 112, 114, and 116 (e.g., using logical operations performed at the latches 112, 114, and 116).

The data storage device 102 includes the controller 120 coupled to the memory 104 (e.g., the one or more memory dies 103) via a bus 106, an interface (e.g., interface circuitry), another structure, or a combination thereof. For example, the bus 106 may include multiple distinct channels to enable the controller 120 to communicate with each of the one or more memory dies 103 in parallel with, and independently of, communication with the other memory dies 103. In some implementations, the memory 104 may be a flash memory.

The controller 120 is configured to receive data and instructions from the host device 150 and to send data to the host device 150. For example, the controller 120 may send data to the host device 150 via the interface 108, and the controller 120 may receive data from the host device 150 via the interface 108. The controller 120 is configured to send data and commands (e.g., the memory operation 136) to the memory 104 and to receive data and fixed size compressed soft-bits from the memory 104. For example, the controller 120 is configured to send data and a write command to cause the memory 104 to store data to a specified address of the memory 104. The write command may specify a physical address of a portion of the memory 104 (e.g., a physical address of a word line of the memory 104) that is to store the data.

The controller 120 is configured to send a read command to the memory 104 to access data from a specified address of the memory 104. The read command may specify the physical address of a region of the memory 104 (e.g., a physical address of a word line of the memory 104). The controller 120 may also be configured to send data and commands to the memory 104 associated with background scanning operations, garbage collection operations, and/or wear-leveling operations, or other suitable memory operations.

The controller 120 may include a memory 124, an error correction code (ECC) engine 126, and the processor 128. The memory 124 may be configured to store data and/or instructions that may be executable by the processor 128. The memory 124 may include soft-bit lossy decompressor 160, a soft-bits database 162, and a LLR Adjustment Application 164. The soft-bit lossy decompressor 160 may be a hardware circuit or instructions that are executable by the processor 128. The LLR Adjustment Application 164 may cause the processor 128 to adjust the Log-Likelihood-Ratios (LLRs) of the ECC decoder 126 based on a soft-bit page quality with respect to compression errors as described in greater detail below with respect to FIG. 5. Additionally, in other examples, the LLR Adjustment Application 164 may cause the ECC decoder 126 to adjust the LLRs of the ECC decoder 126 based on the soft-bit page quality. In yet other examples, an application or circuitry separate and distinct from any application stored in the memory 124 may adjust the LLRs of the ECC decoder 126 based on the soft-bit page quality.

The controller 120 may send the memory operation 136 (e.g., a read command) to the memory device 104 to cause the read/write circuitry 140 to sense data stored in a storage element. For example, the controller 120 may send the read command to the memory device 104 in response to receiving a request for read access from the host device 150. In response to receiving the read command, the memory device 104 may sense the storage region 107A (e.g., using the read/write circuitry 140) to generate one or more sets of bits, such as a set of hard bits representing the data and a set of soft-bits. The set of soft-bits may indicate reliability information useable by the ECC engine 126 during decoding of the corresponding set of hard bits.

The set of hard bits may represent a single logical page or one or more logical pages. The set of soft-bits may represent a corresponding single logical page or a corresponding one or more logical pages.

The compressed soft-bit (CSB) circuitry 118 allows defined memory spaces, such as pages, to be split into smaller fixed size segments. For example, the adaptive soft-bit compression described below allows the memory controller 120 to read data from the defined memory spaces, i.e., the pages split into 64-bit fixed size segments because the CSB circuitry 118 adaptively compresses soft-bits corresponding to the 64-bit fixed size segments to an even smaller fixed size (e.g. 12 bits) based on NAND conditions and/or system conditions. This splitting of the defined memory spaces simplifies and increases the efficiency of the read operations of the memory controller 120 and the adaptively compressed soft-bits decreases the necessary bus width for performing read operations with soft-bits.

The compressed soft-bit (CSB) circuitry 118 also allows for adaptive lossy compression to be performed in a distributed manner. For example, the latches 116 and the CSB circuitry 118 may perform the adaptive compression, separately or in combination with each other (e.g., parallel, staggered, or other suitable combination) and output the second set of soft-bits 138 to the controller 120 via the bus 106.

Figure 2:
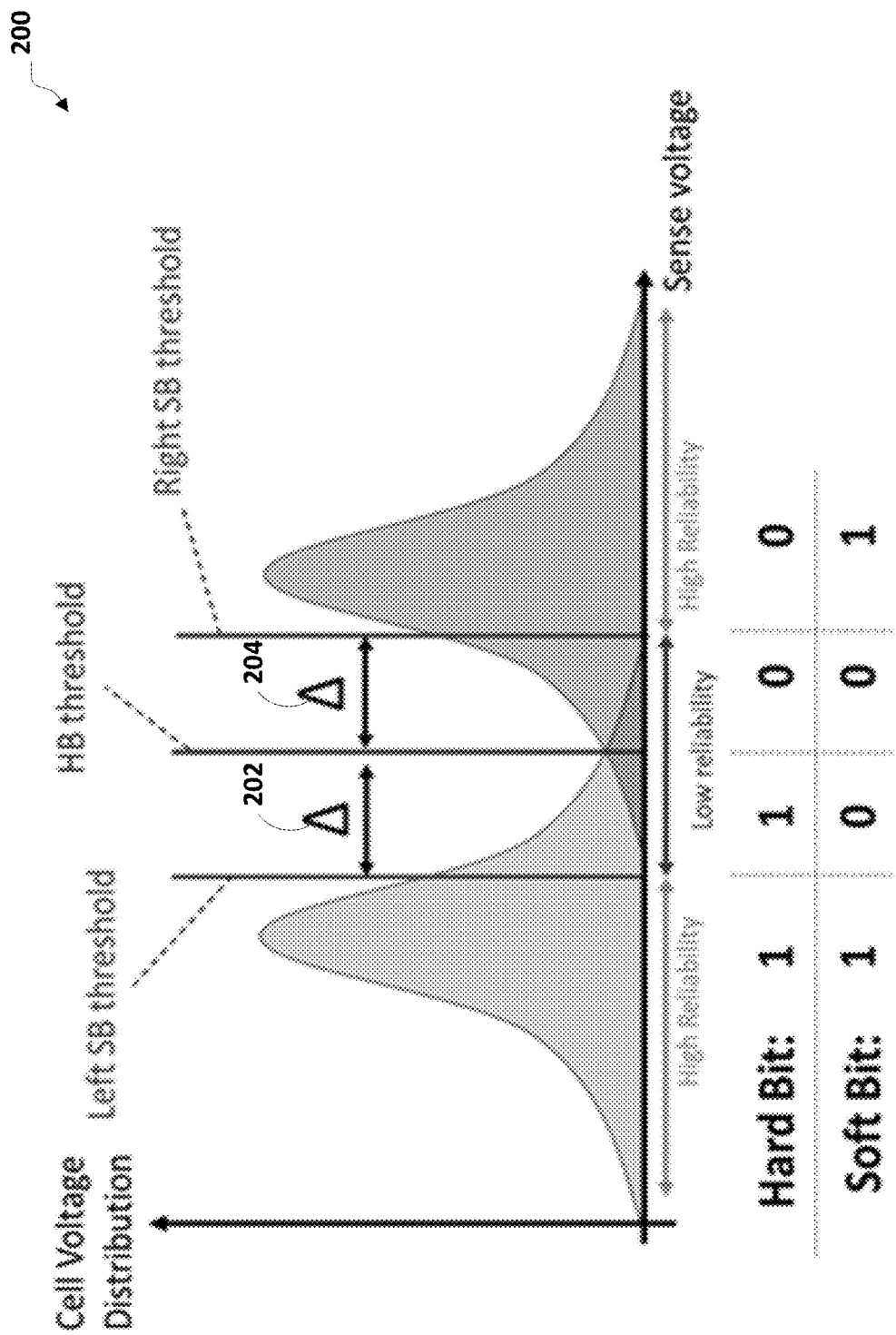
FIG. 2 is a diagram illustrating a soft-bit read, in accordance with various aspects of the present disclosure.

FIG. 2 is a diagram illustrating a soft-bit read 200, in accordance with various aspects of the present disclosure. As illustrated in FIG. 2, the "soft-bit delta" is the distance between the hard bit (HB) sense and the soft-bit senses, where the X-axis is the sense voltage and the Y-axis sis the cell voltage distribution. In the example of FIG. 2, the soft-bit read 200 includes a left soft-bit delta 202 and a right soft-bit delta 204.

As illustrated in FIG. 2, the left soft-bit delta 202 and the right soft-bit delta 204 are symmetrical. However, in some examples, the left soft-bit delta 202 and the right soft-bit delta 204 may be asymmetrical, i.e., different from each other.

Further, as illustrated in FIG. 2, adjusting the soft-bit delta (the sense voltage difference between the SB page and the HB page) provides a trade-off. By increasing the soft-bit delta (i.e., increasing the length of the two-sided arrows illustrated in FIG. 2), the "low-reliability" section is expanded and more of the erroneous bits are caught close to the HB threshold and marked as unreliable. However, at the same time, more correct bits are marked as unreliable after expanding the soft-bit delta. The opposite occurs when decreasing the soft-bit delta. In other words, at any given time, the SB delta may have one value that maximizes the information in the soft-bits and changes according to NAND conditions and/or system conditions.

Adding compression to the soft-bits requires an additional consideration. The compressibility of the SB page depends on the entropy of the soft-bit data. As entropy decreases, the compressibility increases. As entropy increases, the compressibility decreases.

In an example where the soft-bit page is sparse, then there is a small amount of bits marked as unreliable ("0" in the example of FIG. 2). The fewer the marked bits, the lower the entropy of the soft-bit data. For a lossless compression scheme, the lower entropy reduces the size of the compressed SB page, which increases the system throughput. For a fixed lossy compression scheme, the lower entropy increases the compression quality, which reduces the amount of information lost in the compression process.

In view of the foregoing, a system using soft-bit compression may adaptively adjust the SB delta or adaptively adjust the compression scheme to maximize the correction capability and performance while considering the system compression and effects. Specifically, while considering the compression and effects on the SB page, and the information loss due to lossy compression.

As the NAND conditions change, the Cell Voltage distribution (CVD) illustrated as the Y-axis also changes resulting in different amounts of errors and reliable/unreliable bits. With a higher BER, the higher correction capability is needed from the decoder (e.g., the ECC decoder 126). A higher correction capability from the decoder may be achieved by a higher compression ratio, a higher or lower soft-bit delta, or some combination thereof.

The higher compression ratio (i.e., less compression) will result in a higher quality soft-bit page. The compression ratio (the ratio between the compressed and uncompressed soft-bit page) is directly related to transfer throughput which in many cases governs the overall performance of the data storage device 102. Similarly, the bigger soft-bit delta marks more bits as unreliable resulting in less compression.

In view of the foregoing, a compression quality refers to the amount of errors introduced due to the lossy compression and an overall soft-bit page quality is a result of both the soft-bit delta and the compression quality. Increasing or decreasing the soft-bit delta may improve or degrade the quality of the soft-bit page from a data perspective as explained above. However, from a compression perspective, increasing the soft-bit delta makes the data harder to compress, so for a given compression ratio the increase in the soft-bit delta results in lower compression quality (e.g., more compression errors). To account for the lower compression quality from the increase in the soft-bit delta, the compression ratio may be raised to maintain the compression quality.

Figure 3:
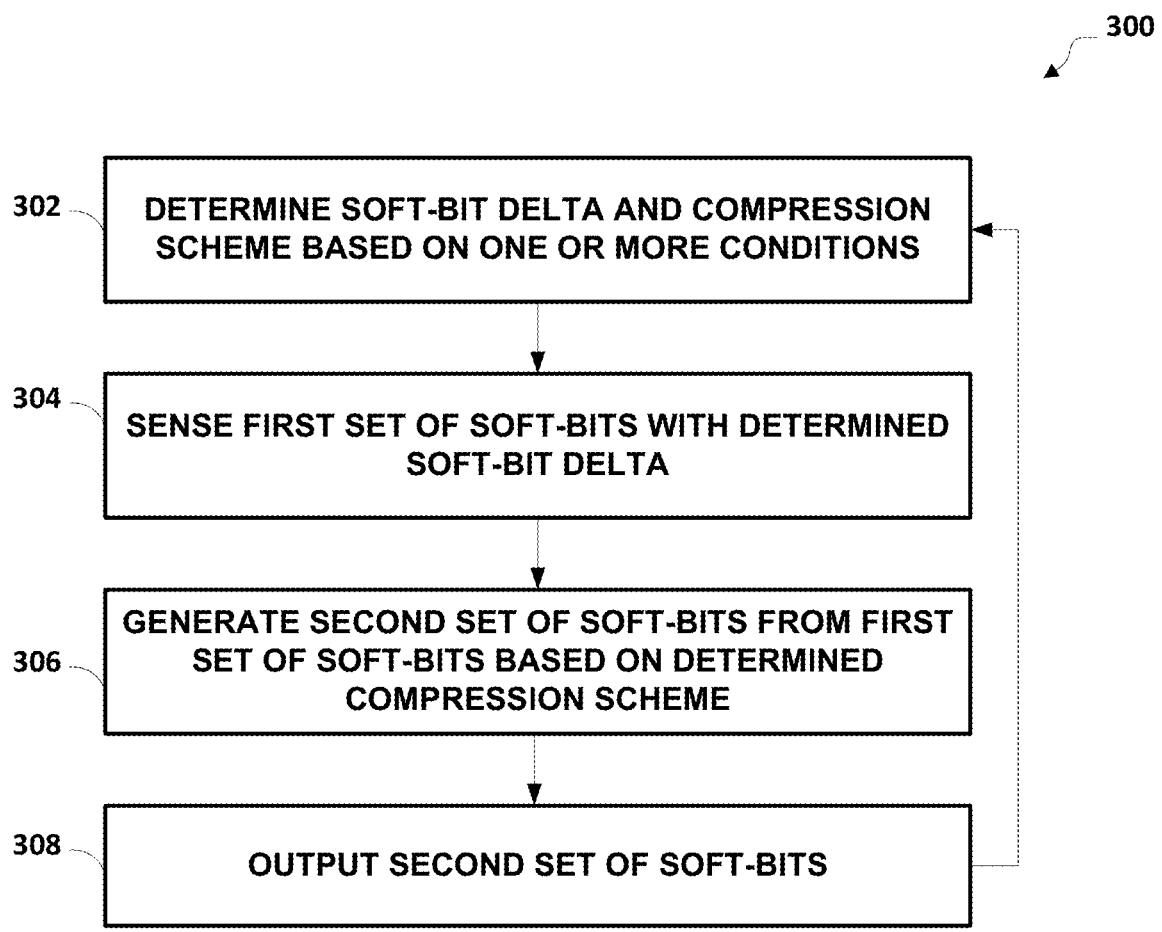
FIG. 3 is a flowchart illustrating an example method for performing adaptive soft-bit compression, in accordance with some embodiments of the disclosure.

FIG. 3 is a flowchart illustrating an example method 300 for performing adaptive soft-bit compression, in accordance with some embodiments of the disclosure. For ease of understanding, the method 300 is described with respect to the CSB circuitry 118. However, the method 300 may be performed in combination with, or separately by, other circuitry in the data storage device 102 (e.g., the processor 128 and the latches 112-116).

In the example of FIG. 3, the method 300 includes determining a soft-bit delta and a compression scheme based on the one or more conditions of the one or more storage elements that are determined (at block 302). For example, the CSB circuitry 118 determines the soft-bit delta and the compression scheme based on the BER that is determined. The CSB circuitry 118 also may determine the soft-bit delta and a compression ratio based on the BER.

The method 300 includes sensing a first set of soft-bits using the determined soft-bit delta (e.g., soft-bit delta locations) (at block 304). For example, the CSB circuitry 118 controls the read/write circuitry 140 to sense a first set of soft-bits using the determined soft-bit delta.

The method 300 includes generating a second set of soft-bits from the first set of soft-bits that are sensed by the read/write circuitry 140 based on the determined compression scheme (at block 306). For example, the CSB circuitry 118 generates the second set of soft-bits from the first set of soft-bits based on the determined compression scheme.

The method 300 includes outputting the second set of soft-bits (at block 308). For example, the CSB circuitry 118 outputs the second set of soft-bits to the controller 120.

In some examples, after transferring the second set of soft-bits to a soft-bit page controller, the method 300 is repeated by re-determining the soft-bit delta and the compression scheme based on the one or more conditions of the one or more storage elements that are determined (at block 302). In other examples, the method 300 may be performed on a per-logical page basis.

Additionally, in some examples, the method 300 may include determining one or more conditions of one or more storage elements before determining the soft-bit delta and the compression scheme. For example, the CSB circuitry 118 may determine NAND conditions (e.g., a bit-error-rate (BER)) of the memory 104 before determining a soft-bit delta and a compression scheme based on the NAND conditions. In some embodiments, other circuitry is provided for determining the BER and the CSB circuitry 118 receives the BER from the other circuitry. In the above examples, the one or more conditions may be determined for each logical page to account for logical pages exhibiting different BER and CVD characteristics.

Figure 4:
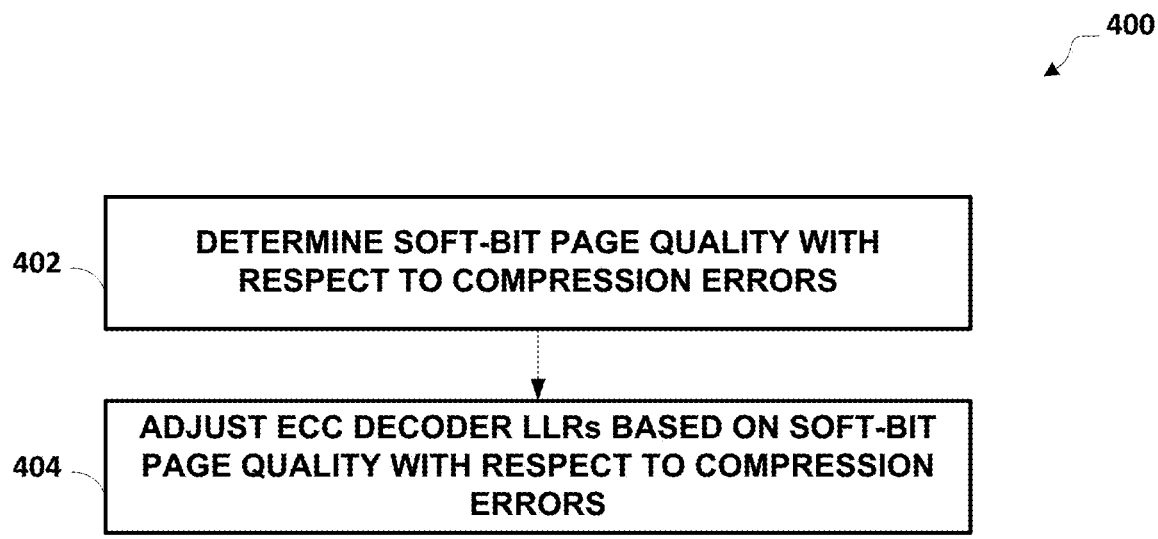
FIG. 4 is a flowchart illustrating an example method for adjusting Log-Likelihood Ratios (LLRs) of an ECC decoder, in accordance with some embodiments of the disclosure.

FIG. 4 is a flowchart illustrating an example method 400 for adjusting Log-Likelihood Ratios (LLRs) of an ECC decoder, in accordance with some embodiments of the disclosure. In the example of FIG. 4, the method 400 includes determining a soft-bit page quality with respect to compression errors (at block 402). For example, the processor 128 of the controller 120, when executing the LLR Adjustment Application 164, may determine a new BER as set forth below in FIG. 5.

The method 400 also includes adjusting Log-Likelihood-Ratios (LLRs) of an ECC decoder based on the soft-bit page quality with respect to the compression errors (at block 404). For example, the processor 128 of the controller 120, when executing the LLR Adjustment Application 164, may adjust the LLRs of the ECC decoder 126 based on the new BER. In some examples, the soft-bit page quality is with respect to the compression errors and the errors induced by the NAND. In other words, the new BER may account for the errors induced by the NAND and by lossy compression.

In some examples, the method 400 may be an extension of the method 300. For example, the determination of the soft-bit page quality with respect to the compression errors may be based at least in part on the compressed soft-bits that are output in the method 300.

Figure 5:
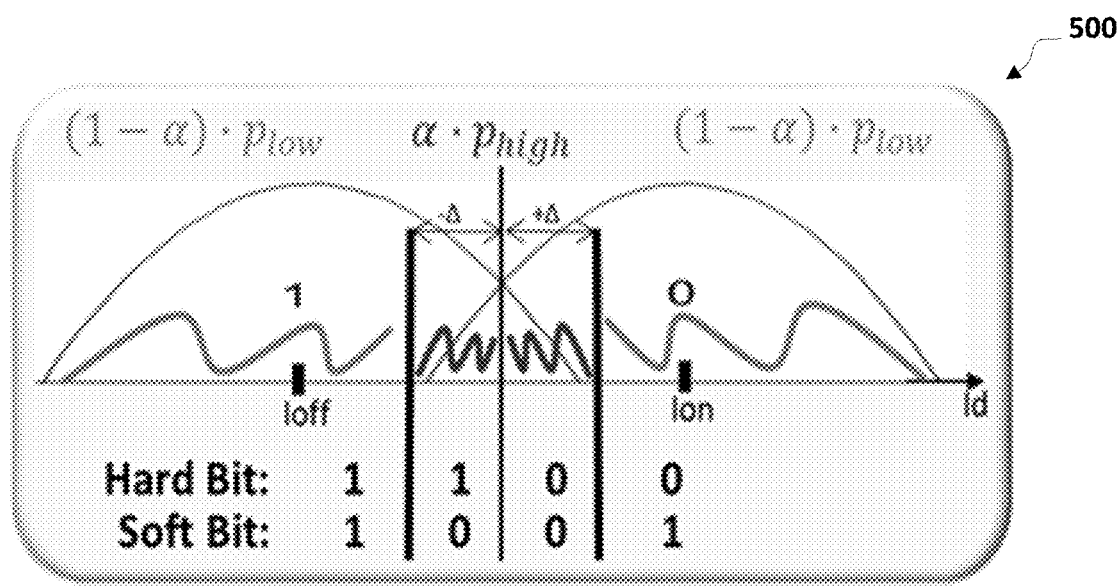
FIG. 5 is a diagram illustrating a calculation of a bit-error-rate per soft-bit bin, in accordance with various aspects of the present disclosure.

FIG. 5 is a diagram illustrating a calculation 500 of a bit-error-rate per soft-bit bin, in accordance with various aspects of the present disclosure. FIG. 5 is described with respect to the processor 128. However, FIG. 5 may be equally applicable to other circuitry in the controller 120, for example, the ECC decoder 126.

Lossy compression schemes may be implemented in fixed compression schemes. That is, the lossy compression schemes operate on separate portions of the soft-bit page and compress them individually into a fixed (smaller) sized vector. For example, each 64-bit portion of the soft-bit page may be compressed into 16-bits, which is a compression ratio of 25%.

The logic on the NAND die is very costly so lossy compression schemes are more practical to implement. However, the downside of lossy compression schemes is the loss of some of the information in the original soft-bit page, i.e., the decompressed page at the decoder side will not be a perfect replicate of the original SB page.

The decoder LLRs represent the reliability of each bit in the voltage bin, and is calculated according to the BER in the bin according to the following expression (*):

$$(*) \; |LLR| = \log_2 \frac{1 - BER}{BER}$$

For the lossy compression schemes, the compression errors may be estimated and added to each bin to adjust the LLRs accordingly by the processor 128, the ECC decoder 126, other dedicated hardware circuit, or a combination thereof. To estimate the errors, the nominal LLRs and the nominal BER per bin may be calculated by the processor 128, the ECC decoder 126, other dedicated hardware circuit, or a combination thereof. Given the BER, a Gaussian CVD may be assumed by the processor 128 to calculate the optimal soft-bit threshold location. The standard-deviation ($\sigma$) of the Gaussian distribution may be calculated by the ECC decoder 126 according the BER in the following expression (1):

$$BER = Q\left(\frac{1}{2\sigma}\right) \rightarrow \sigma = \frac{1}{2Q^{-1}(BER)} \left(\text{where } Q(x) = \frac{1}{\sqrt{2\pi}} \int_x^\infty e^{-v^2/2} dv\right) \quad (1)$$

Assuming that delta ($\Delta$) is the soft-bit threshold offset and alpha ($\alpha$) is the proportion of bits in the low reliability (high BER) bins and ($1-\alpha$) is the proportion of bits in the high reliability (low BER) bins, then in the following expressions (2) and (3):

$$BER = \alpha \cdot p_{low} + (1 - \alpha) \cdot p_{high} \rightarrow \alpha = Q\left(\frac{0.5 - \Delta}{\sigma}\right) - Q\left(\frac{0.5 + \Delta}{\sigma}\right) \quad (2)$$

$$p_{high} = \frac{Q\left(\frac{0.5}{\sigma}\right) - Q\left(\frac{0.5 + \Delta}{\sigma}\right)}{\alpha}, \; p_{low} = \frac{Q\left(\frac{0.5 + \Delta}{\sigma}\right)}{1 - \alpha} \quad (3)$$

Using the BER for the reliable/unreliable bins ($p_{low}$ and $p_{high}$), magnitude of the nominal LLRs may be calculated by the processor 128 according to the above expression (*).

In view of the foregoing, the processor 128 may adjust the BER per bin according to the expected compression errors. For example, assuming a fixed lossy compression of 64-bit to 16 bit, the CSB circuitry 118 may use the lossy compression scheme to mark and reconstruct up to three unreliable bits (e.g., three "0's") in each 64-bits and compress their location to 16-bits. Any additional 0's in each 64-bit vector will be discarded, that is, reconstructed as a "1" at the controller 120 by the processor 128. This means that the compression errors in this lossy compression scheme causes the processor 128 to move unreliable bits from the unreliable bin to the reliable bin.

The processor 128 calculates the expected proportion of compression errors, that is, the number of bits that are the fourth unreliable bit or above (fifth unreliable bit, sixth unreliable bit, etc.) inside a 64-bit vector with the following expression (4):

$$\beta = \frac{1}{64} \sum_{i=4}^{64} (i-3) \binom{64}{i} \alpha^i (1-\alpha)^{64-i} \quad (4)$$

Therefore, the new bit error rate (BER) of the bits in the reliable bin is the following expression (5):

$$\overline{p}_{low} = \frac{(1-\alpha)p_{low} + \beta p_{high}}{(1-\alpha) + \beta} \quad (5)$$

As the processor 128 is only moving bits from the unreliable bin to the reliable bin, then the BER in the unreliable bin remains unchanged as $p_{high}$. Therefore, the processor 128 may use the adjusted BERs ($p_{high}$, $p_{low}$) to calculate the adjusted LLRs magnitude using the expression (*) above.

Figure 6:
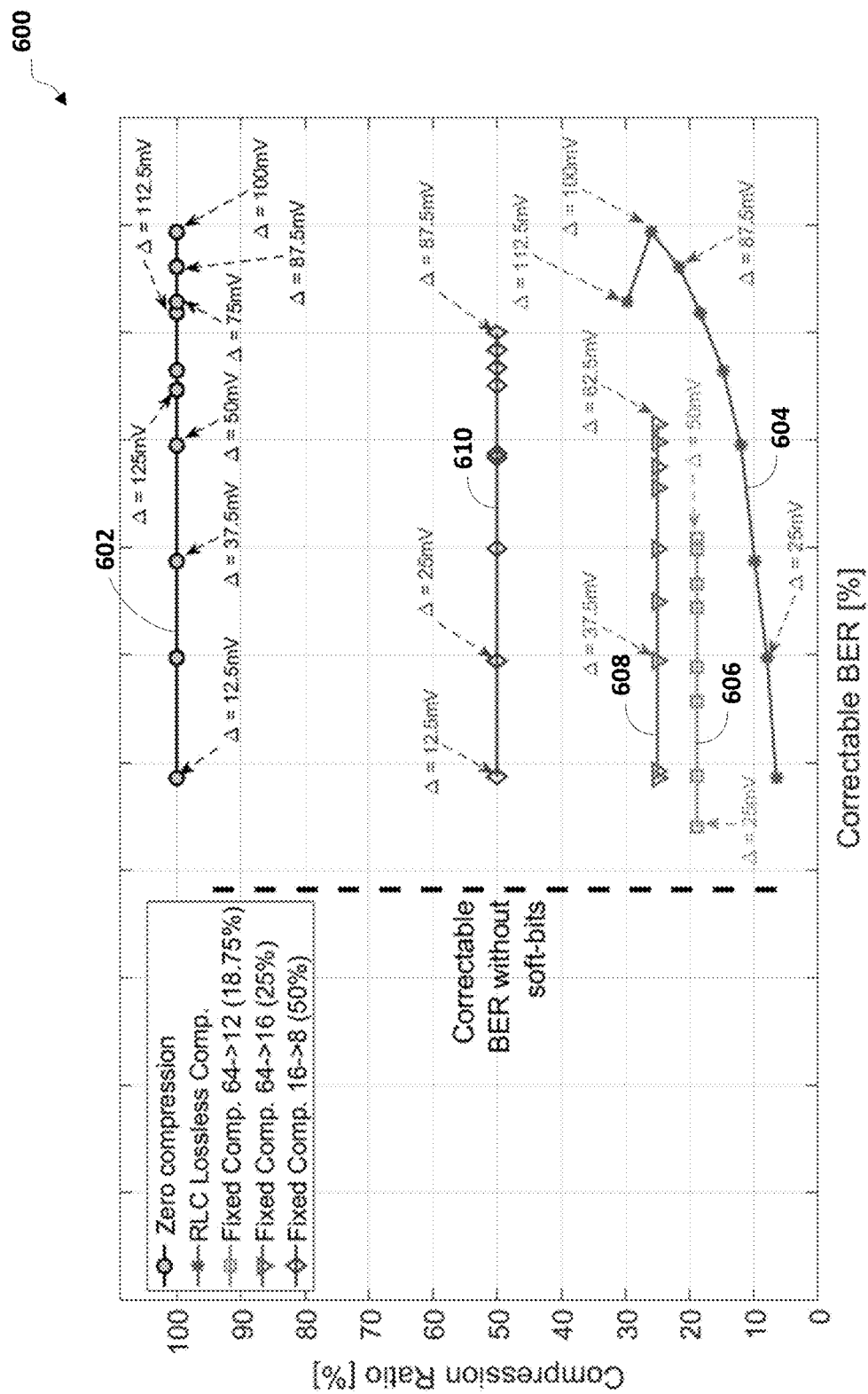
FIG. 6 is a graph illustrating an analysis of a relationship between soft-bit delta, compression ratio, and an ECC correction capability, in accordance with various aspects of the present disclosure.

FIG. 6 is a graph illustrating an analysis 600 of a relationship between soft-bit delta, compression ratio, and an ECC correction capability, in accordance with various aspects of the present disclosure. In the example of FIG. 6, the analysis 600 includes a zero-compression scheme 602, a variable lossless compression scheme 604, a first fixed lossy compression scheme 606, a second fixed lossy compression scheme 608, and a third fixed lossy compression scheme 610.

The zero-compression scheme 602 has a 100% compression ratio, which is zero compression. The variable lossless compression scheme 604 is a run-length-coding (RLC) lossless compression with a variable compression ratio. The first fixed lossy compression scheme 606 has a 18.75% compression ratio, for example, 64-bit to 12-bit compression. The second fixed lossy compression scheme 608 has a 25% compression ratio, for example, 64-bit to 16-bit compression. The third fixed compression scheme 610 has a 50% compression ratio, for example, 16-bit to 8-bit compression.

For each of the schemes 602-610, a different soft-bit delta results in the best correction capability. When using the zero-compression scheme 602, the soft-bit delta with the best correction capability is 100 mV. When using the fixed lossy compression schemes 604-608 with compression rates 18.75%, 25%, and 50%, the soft-bit delta with the best correction capability is 50 mV, 62.5 mV, and 87.5 mV respectively.

When using the variable lossless compression scheme 604, the soft-bit delta with the best correction capability changes as the BER rises. When the BER is low (below a first threshold), the soft-bit delta with the best correction capability may be 37.5 mV. When the BER is high (exceeds the first threshold), the soft-bit delta with the best correction capability may be 100 mV.

In the analysis 600, the vertical axis is the compression ratio (i.e., ratio between the compressed and uncompressed data) and the horizontal axis shows the resulting correctable BER As mentioned above, the compression ratio directly controls the amount of data transferred to the controller 120, and in many scenarios, will dictate the overall system performance.

For each of the schemes, the resulting compression ratio and correctable BER for different SB deltas is shown. As illustrated in FIG. 6, there is a wide variance between the achievable compression ratio (system read performance) depending on the required correctable BER.

A use case for the system 100 is using high compression when the BER is low, and slowly increasing the soft-bit delta and compression ratio as the BER rises. For example, when BER is low (below a first threshold), the CSB circuitry 118 selects the first fixed lossy compression scheme 606 at 50 mV. As BER rises (exceeds the first threshold), the CSB circuitry 118 may switch from the first fixed lossy compression scheme 606 to the second fixed lossy compression scheme 608 at 62.5 mV. As BER continues to rise (exceeds a second threshold), the CSB circuitry 118 may switch from the second fixed lossy compression scheme 610 to the third fixed lossy compression scheme 610 at 87.5 mV.

In some examples, due to implementation costs, only the fixed lossy compression schemes may be available to the CSB circuitry 118. In other examples, when BER reaches a maximum (reaches a zero-compression threshold), then the CSB circuitry 118 may switch from the third fixed lossy compression scheme 610 to the zero compression scheme 602 at 100 mV. In yet other examples, the CSB circuitry 118 may start with the variable lossless compression scheme 604 at 75 mV and 100 mV instead of the first fixed lossy compression scheme 606 and the second fixed lossy compression scheme 608 at 50 mV and 62.5 mV, respectively.

As illustrated in FIG. 6, the effect of the soft-bit delta and the compression scheme (lossy, lossless, and zero compression) has a dramatic effect on correction capability and transfer throughput. The adjusting of the soft-bit delta and/or the compression scheme based on NAND conditions (and/or system conditions) improves read throughput and reduces power by considerable factors (the soft-bit page size may be substantially reduced while adaptively matching their quality to available conditions). Furthermore, adapting the ECC parameters to the quality of the soft-bits (as described above in FIG. 5) optimizes the ECC decoder performance to take full advantage of the information in the soft-bits, improving correction capability, and reducing both decoding latency and power.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A memory, comprising:
   one or more storage elements;
   compressed soft-bit circuitry configured to:
      determine a soft-bit delta and one compression scheme of a plurality of compression schemes based on one or more conditions of the one or more storage elements;
   read/write circuitry configured to:
      read a set of hard bits from the one or more storage elements, and
      sense a first set of soft-bits using the determined soft-bit delta while reading the set of hard bits from the one or more storage elements, the first set of soft-bits having a first fixed size, and each soft-bit of the first set of soft-bits indicating a reliability of a corresponding hard bit of the set of hard bits,
   wherein the compressed soft-bit circuitry is further configured to:

receive the first set of soft-bits, generate a second set of soft-bits from the first set of soft-bits based on the one compression scheme that is determined, and output the second set of soft-bits.

2. The memory of claim 1, wherein the compressed soft-bit circuitry is further configured to:

determine the one or more conditions of the one or more storage elements, wherein the one or more conditions is a first bit error rate (BER) below a first threshold, wherein, to determine the soft-bit delta and the one compression scheme based on the one or more conditions, the compressed soft-bit circuitry is further configured to determine that the one compression scheme is a first fixed lossy compression scheme, and wherein the second set of soft-bits have a second fixed size that is smaller than the first fixed size.

3. The memory of claim 2, wherein the one or more conditions is a second bit error rate (BER) at or above the first threshold and below a second threshold, wherein, to determine the soft-bit delta and the one compression scheme based on the one or more conditions, the compressed soft-bit circuitry is further configured to determine that the one compression scheme is a second fixed lossy compression scheme, and wherein the second set of soft-bits have a third fixed size that is smaller than the first fixed size and larger than the second fixed size.

4. The memory of claim 3, wherein the one or more conditions is a third bit error rate (BER) at or above the second threshold, wherein, to determine the soft-bit delta and the one compression scheme based on the one or more conditions, the compressed soft-bit circuitry is further configured to determine that the one compression scheme is a third fixed lossy compression scheme, and wherein the second set of soft-bits have a fourth fixed size that is smaller than the first fixed size and larger than the second fixed size and the third fixed size.

5. The memory of claim 1, wherein the compressed soft-bit circuitry is further configured to:

determine the one or more conditions of the one or more storage elements, wherein the one or more conditions is a first bit error rate (BER) at or above a zero compression threshold, wherein, to determine the soft-bit delta and the one compression scheme based on the one or more conditions, the compressed soft-bit circuitry is further configured to determine that the one compression scheme is a zero compression scheme, and wherein the second set of soft-bits have a second fixed size that is the same as the first fixed size.

6. The memory of claim 1, wherein the compressed soft-bit circuitry is further configured to:

determine the one or more conditions of the one or more storage elements, wherein the one or more conditions is a first bit error rate (BER) below a first threshold, wherein, to determine the soft-bit delta and the one compression scheme based on the one or more conditions, the compressed soft-bit circuitry is further configured to determine that the one compression scheme is a first variable lossless compression scheme, and wherein the second set of soft-bits have a second fixed size that is smaller than the first fixed size.

7. The memory of claim 6, wherein the one or more conditions is a second bit error rate (BER) at or above the first threshold and below a second threshold, wherein, to determine the soft-bit delta and the one compression scheme based on the one or more conditions, the compressed soft-bit circuitry is further configured to determine that the one compression scheme is a first fixed lossy compression scheme, and wherein the second set of soft-bits have a third fixed size that is smaller than the first fixed size and larger than the second fixed size.

8. A method comprising:

determining, with compressed soft-bit circuitry, a soft-bit delta and one compression scheme of a plurality of compression schemes based on one or more conditions of one or more storage elements;

reading, with read/write circuitry, a set of hard bits from the one or more storage elements;

sensing, with the compressed soft-bit circuitry, a first set of soft-bits using the determined soft-bit delta while reading the set of hard bits from the one or more storage elements, the first set of soft-bits having a first fixed size, and each soft-bit of the first set of soft-bits indicating a reliability of a corresponding hard bit of the set of hard bits;

receiving, with the compressed soft-bit circuitry, the first set of soft-bits;

generating, with the compressed soft-bit circuitry, a second set of soft-bits from the first set of soft-bits based on the one compression scheme that is determined; and outputting the second set of soft-bits.

9. The method of claim 8, further comprising:

determining, with the compressed soft-bit circuitry, the one or more conditions of the one or more storage elements, wherein the one or more conditions is a first bit error rate (BER) below a first threshold, wherein determining the soft-bit delta and the one compression scheme based on the one or more conditions further includes determining that the one compression scheme is a first fixed lossy compression scheme based on the first BER, and wherein the second set of soft-bits have a second fixed size that is smaller than the first fixed size.

10. The method of claim 9, wherein the one or more conditions is a second BER at or above the first threshold and below a second threshold, wherein determining the soft-bit delta and the one compression scheme based on the one or more conditions further includes determining that the one compression scheme is a second fixed lossy compression scheme based on the second BER, and wherein the second set of soft-bits have a third fixed size that is smaller than the first fixed size and larger than the second fixed size.

11. The method of claim 10, wherein the one or more conditions is a third BER at or above the second threshold, wherein determining the soft-bit delta and the one compression scheme based on the one or more conditions further includes determining that the one compression scheme is a third fixed lossy compression scheme based on the third BER, and wherein the second set of soft-bits have a fourth fixed size that is smaller than the first fixed size and larger than the second fixed size and the third fixed size.

12. The method of claim 8, further comprising:

determining, with the compressed soft-bit circuitry, the one or more conditions of the one or more storage elements, wherein the one or more conditions is a first bit error rate (BER) at or above a zero compression threshold, wherein determining the soft-bit delta and the one compression scheme based on the one or more conditions further includes determining that the one compression scheme is a zero compression scheme based on the first BER, and wherein the second set of soft-bits have a second fixed size that is the same as the first fixed size.

13. The method of claim 8, further comprising:
determining, with the compressed soft-bit circuitry, the one or more conditions of the one or more storage elements,
wherein the one or more conditions is a first bit error rate (BER) below a first threshold, wherein determining the soft-bit delta and the one compression scheme based on the one or more conditions further includes determining that the one compression scheme is a variable lossless compression scheme based on the first BER, and wherein the second set of soft-bits have a second fixed size that is smaller than the first fixed size.

14. The method of claim 13, wherein the one or more conditions is a second BER at or above the first threshold and below a second threshold, wherein determining the soft-bit delta and the one compression scheme based on the one or more conditions further includes that the one compression scheme is a first fixed lossy compression scheme based on the second BER, and wherein the second set of soft-bits have a third fixed size that is smaller than the first fixed size and larger than the second fixed size.

15. The method of claim 8, further comprising:
determining a soft-bit page quality with respect to compression errors; and
adjusting log-likelihood-ratios (LLRs) based on the soft-bit page quality with respect to the compression errors.

16. An apparatus comprising:
means for determining a soft-bit delta and one compression scheme of a plurality of compression schemes based on one or more conditions of one or more storage elements;
means for reading a set of hard bits from the one or more storage elements;
means for sensing a first set of soft-bits using the determined soft-bit delta while reading the set of hard bits from the one or more storage elements, the first set of soft-bits having a first fixed size, and each soft-bit of the first set of soft-bits indicating a reliability of a corresponding hard bit of the set of hard bits;
means for receiving the first set of soft-bits;
means for generating a second set of soft-bits from the first set of soft-bits based on the one compression scheme that is determined; and
means for outputting the second set of soft-bits.

17. The apparatus of claim 16, further comprising:
means for determining the one or more conditions of the one or more storage elements,
wherein the one or more conditions is a first bit error rate (BER) below a first threshold, wherein the means for determining the soft-bit delta and the one compression scheme based on the one or more conditions further includes a means for determining that the one compression scheme is a first fixed lossy compression scheme based on the first BER, and wherein the second set of soft-bits have a second fixed size that is smaller than the first fixed size.

18. The apparatus of claim 17, wherein the one or more conditions is a second BER at or above the first threshold and below a second threshold, wherein the means for determining the soft-bit delta and the one compression scheme based on the one or more conditions further includes a means for determining that the one compression scheme is a second fixed lossy compression scheme based on the second BER, and wherein the second set of soft-bits have a third fixed size that is smaller than the first fixed size and larger than the second fixed size.

19. The apparatus of claim 18, wherein the one or more conditions is a third BER at or above the second threshold, wherein the means for determining the soft-bit delta and the one compression scheme based on the one or more conditions further includes a means for determining that the one compression scheme is a third fixed lossy compression scheme based on the third BER, and wherein the second set of soft-bits have a fourth fixed size that is smaller than the first fixed size and larger than the second fixed size and the third fixed size.

20. The apparatus of claim 16, further comprising:
means for determining a soft-bit page quality with respect to compression errors; and
means for adjusting Log-Likelihood-Ratios (LLRs) based on the soft-bit page quality with respect to the compression errors.

* * * * *